(12) United States Patent
Mease

(10) Patent No.: US 6,665,908 B1
(45) Date of Patent: Dec. 23, 2003

(54) MODULAR COMPUTER SYSTEM AND LATCHING HANDLE FOR SAME

(75) Inventor: Keith D. Mease, Gibbstown, NJ (US)

(73) Assignee: Unisys Corporation, Blue Bell, PA (US)

(*) Notice: Subject to any disclaimer, the term of this patent is extended or adjusted under 35 U.S.C. 154(b) by 38 days.

(21) Appl. No.: 10/016,097

(22) Filed: Oct. 31, 2001

(51) Int. Cl.[7] .............................................. A45C 13/22
(52) U.S. Cl. .......................... 16/422; 361/685; 312/122
(58) Field of Search ......................... 16/422, 415, 418, 16/419, DIG. 18, DIG. 24; 361/685, 727; 312/119, 122

(56) References Cited

U.S. PATENT DOCUMENTS

| | | | | |
|---|---|---|---|---|
| 3,245,546 A | * | 4/1966 | Stuhler | 211/41.17 |
| 3,567,303 A | * | 3/1971 | Fox et al. | 312/332.1 |
| 3,861,733 A | * | 1/1975 | Vander Mey | 294/33 |
| 4,393,540 A | * | 7/1983 | Yamamoto et al. | 16/422 |
| 4,435,029 A | * | 3/1984 | McKenzie | 312/332.1 |
| 4,912,808 A | * | 4/1990 | Blakely | 16/422 |
| 5,978,212 A | * | 11/1999 | Boulay et al. | 361/685 |
| 6,236,573 B1 | * | 5/2001 | Gundlach et al. | 361/801 |
| 6,406,257 B1 | * | 6/2002 | Houdek | 415/213.1 |
| 6,556,437 B1 | * | 4/2003 | Hardin | 361/687 |

* cited by examiner

Primary Examiner—Anthony Knight
Assistant Examiner—Doug Hutton
(74) Attorney, Agent, or Firm—Lise A. Rode; Mark T. Starr; Ratner Prestia

(57) ABSTRACT

A handle is provided for moving a component with respect to a receptacle along an insertion axis. The handle includes a grasping portion and flexible latching portions extending from the grasping portion, each of which latching portions is configured to extend substantially parallel to the insertion axis, and each of which latching portions includes an engagement surface extending substantially perpendicular to the insertion axis and being configured to engage a surface of the receptacle. Manipulation of the grasping portion in a direction to remove the component from the receptacle deflects the latching portions toward the insertion axis, thereby releasing the surface of each of the latching portions from engagement with the surface of the receptacle. A module configured to be inserted into a receptacle along an insertion axis, and a modular computer system including such a modular component, are also provided.

15 Claims, 4 Drawing Sheets

MODULAR COMPUTER SYSTEM AND LATCHING HANDLE FOR SAME

FIELD OF THE INVENTION

This invention relates to a modular computer system. More particularly, this invention relates to a latching handle for use in a modular computer system.

BACKGROUND OF THE INVENTION

Plug-in assemblies and component modules in electronic systems often benefit from mechanical fixation in their mating assemblies. Generally, such electronic systems may include a feature such as a handle for manipulating the plug-in assemblies and component modules.

Nevertheless, there remains a need for a latching handle that is capable of reducing the need for components such as screws, locking levers, and other additional components. Also, with increased packing densities it becomes advantageous to reduce the allocation of product volume to such handling features. Additionally, when components require servicing or removal and insertion for other reasons, handling features help to ensure that plug-in assemblies and component modules can be easily manipulated.

SUMMARY OF THE INVENTION

According to one aspect of this invention, a handle is provided for moving a component with respect to a receptacle along an insertion axis. The handle includes a grasping portion and flexible latching portions extending from the grasping portion. Each of the latching portions is configured to extend substantially parallel to the insertion axis, and each of the latching portions includes an engagement surface extending substantially perpendicular to the insertion axis and is configured to engage a surface of the receptacle. Manipulation of the grasping portion of the handle in a direction to remove the component from the receptacle deflects the latching portions toward the insertion axis. In this manner, the surface of each of the latching portions is released from engagement with the surface of the receptacle.

According to another aspect of this invention, a module is provided that is configured to be inserted into a receptacle along an insertion axis. The module includes a component having an insertion axis. The module also includes a handle mounted to the component. The handle includes a grasping portion extending substantially perpendicular to the insertion axis and at least one latching portion extending substantially parallel to the insertion axis. The latching portion includes a surface configured to engage a surface of the receptacle. Manipulation of the grasping portion in a direction to remove the component from the receptacle deflects the latching portion toward the insertion axis. In this manner, the surface of the latching portion is released from engagement with the receptacle.

According to yet another aspect of this invention, a modular computer system is provided including a receptacle defining an engagement surface, an enclosure configured to extend within the receptacle along an insertion axis, and a flexible handle mounted to the enclosure. The handle includes a grasping portion extending substantially perpendicular to the insertion axis and at least one latching portion extending substantially parallel to the insertion axis. The latching portion includes a surface configured to engage the engagement surface of the receptacle upon insertion of the enclosure. The surface of the latching portion extends substantially perpendicular to the insertion axis, and manipulation of the grasping portion in a direction to remove the enclosure from the receptacle deflects the latching portion toward the insertion axis and at least partially within a recess of the enclosure. In this manner, the surface of the latching portion is released from engagement with the engagement surface of the receptacle.

BRIEF DESCRIPTION OF THE DRAWINGS

The invention will be described with reference to the exemplary embodiments illustrated in the figures, of which.

DETAILED DESCRIPTION OF THE INVENTION

Figure 1:
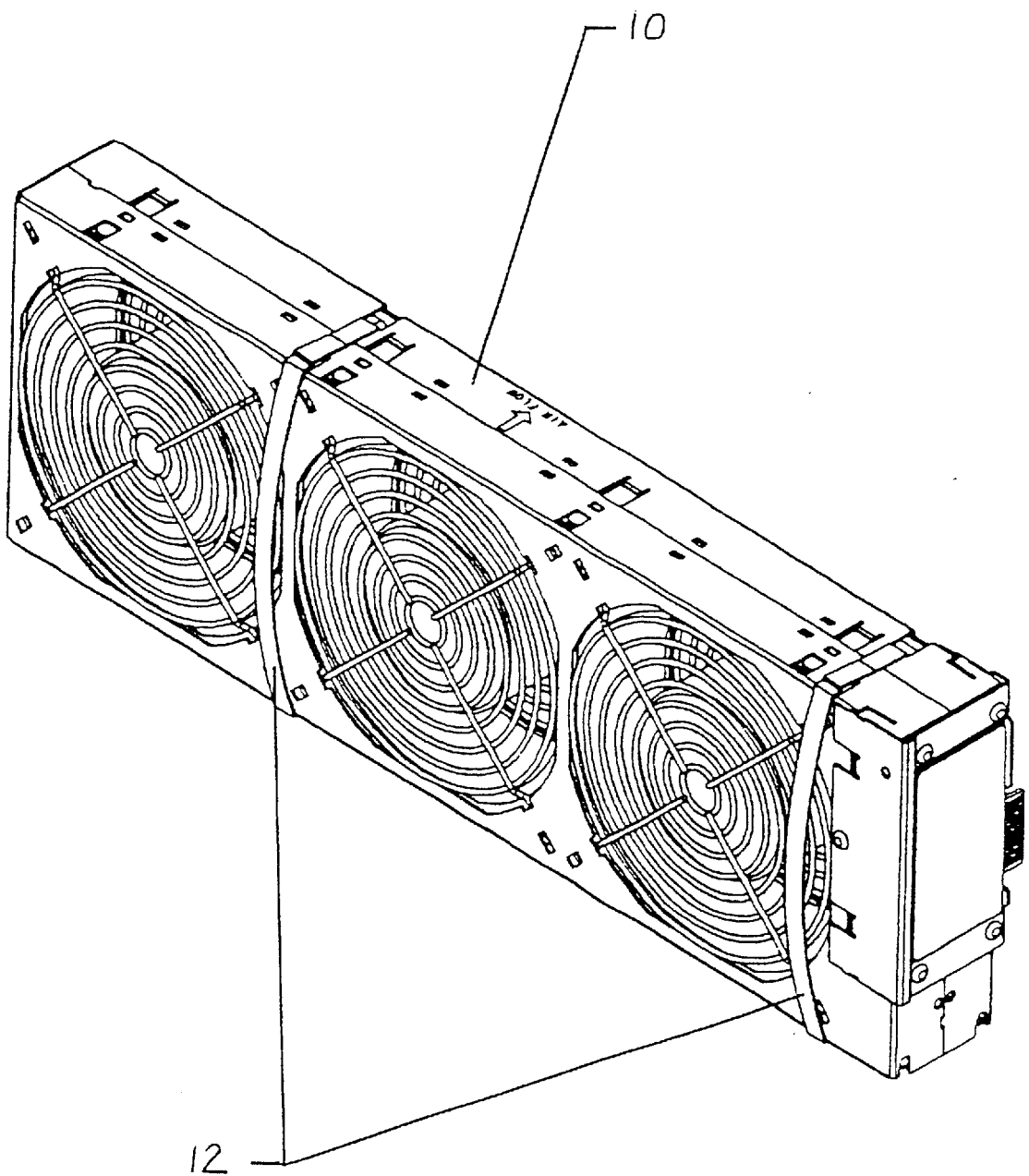
FIG. 1 is a front, perspective view of an embodiment of a modular component according to aspects of this invention.

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Generally, referring to FIGS. 1–4B, a handle 12 is provided for moving a component 10 with respect to a receptacle 30 along an insertion axis "X." The handle 12 includes a grasping portion 14 and flexible latching portions 16 extending from the grasping portion 14. Each of the latching portions 16 is configured to extend substantially parallel to the insertion axis "X," and each of the latching portions 16 includes an engagement surface 20 extending substantially perpendicular to the insertion axis "X" and is configured to engage a surface 34 of the receptacle 30. Manipulation of the grasping portion 14 of the handle 12 in a direction "D" to remove the component 10 from the receptacle 30 deflects the latching portions 16 toward the insertion axis "X." In this manner, the surface 20 of each of the latching portions 16 is released from engagement with the surface 34 of the receptacle 30.

Another aspect of this invention provides a module 10 configured to be inserted into a receptacle 30 along an insertion axis "X." The module 10 includes a component having an insertion axis "X." The module 10 also includes a handle 12 mounted to the component. The handle 12 includes a grasping portion 14 extending substantially perpendicular to the insertion axis "X" and at least one latching portion 16 extending substantially parallel to the insertion axis "X." The latching portion 16 includes a surface 20 configured to engage a surface 34 of the receptacle 30. Manipulation of the grasping portion 14 in a direction "D" to remove the component from the receptacle 30 deflects the latching portion 16 toward the insertion axis "X." In this manner, the surface 20 of the latching portion 16 is released from engagement with the surface 34 of the receptacle 30.

According to yet another aspect of this invention, a modular computer system (FIGS. 4A and 4B) includes a receptacle 30 defining an engagement surface 34. The modular computer system also includes an enclosure 24 such as that of modular component 10 configured to extend within the receptacle 30, and a flexible handle 12 mounted to the enclosure 24. The handle 12 includes a grasping portion 14 extending substantially perpendicular to the insertion axis "X" and at least one latching portion 16 extending substantially parallel to the insertion axis "X." The latching portion 16 includes a surface 20 configured to engage the engagement surface 34 of the receptacle 30 upon insertion of the enclosure 24. The surface 20 of the latching portion 16 extends substantially perpendicular to the insertion axis "X," and manipulation of the grasping portion 14 in a direction "D" to remove the enclosure 24 from the receptacle 30 deflects the latching portion 16 toward the insertion axis "X" and at least partially within a recess 26 of the enclosure 24. In this manner, the surface 20 of the latching portion 16 is released from engagement with the engagement surface 34 of the receptacle 30.

Referring specifically to FIG. 1, a modular component 10 includes an enclosure or housing to which one or more handles 12 are attached. Additional details of the modular component 10 can be found in co-pending U.S. patent application Ser. No. 10/016,582, filed Oct. 31, 2001, the title of which is AIR MOVER ASSEMBLY AND METHOD AND METHOD FOR ENCLOSING AN AIR MOVER, which application is incorporated herein by reference.

Figure 2:
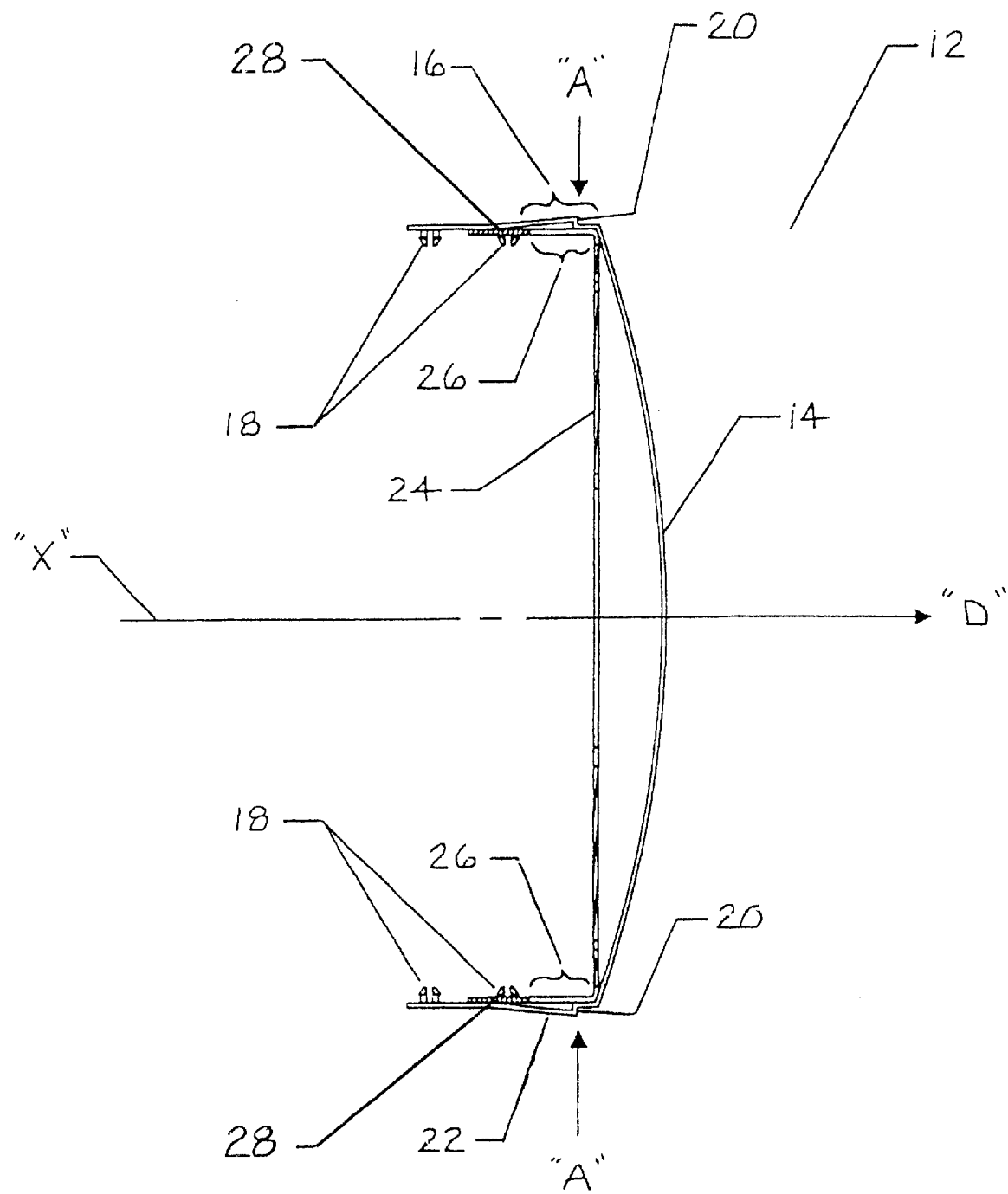
FIG. 2 is a cross-sectional side view of an embodiment of a handle and modular component illustrated in FIG. 1.

Referring specifically to FIG. 2, which provides a side view of the handle and modular component illustrated in FIG. 1, at least one handle 12 is attached to an enclosure 24. The enclosure 24 is configured to be manipulated along an insertion axis X so that it can be removed, for example, in a direction of removal "D."

The exemplary embodiment of handle 12 illustrated in FIG. 2 includes a grasping portion 14 and at least one latching portion 16 (two such latching portions are illustrated in the embodiment of FIG. 2). At or adjacent each latching portion 16 are one or more detents 18, the purpose of which will be described later. Each latching portion 16 also includes an engagement surface 20 which, like grasping portion 14, extends substantially perpendicular to the insertion axis "X." Each latching portion 16 also includes a ramp 22 that extends adjacent to engagement surface 20. As will be described subsequently in greater detail, engagement surface 20 facilitates engagement between the enclosure 24 and a chassis or receptacle (not shown in FIG. 2). Also, as will be described subsequently in greater detail, the ramp 22 of each latching portion facilitates insertion of the enclosure 24 into the receptacle or chassis.

The enclosure 24, in the embodiment illustrated in FIG. 2, includes a slot or cutout 26 positioned to correspond to the latching portion 16 of the handle 12. The enclosure 24 also includes one or more apertures 28 positioned and sized to receive detents 18 of the handle 12, thereby facilitating engagement between the handle 12 and the enclosure 24.

As will be described in detail with reference to FIGS. 4A and 4B, each slot 26 in the enclosure 24 permits inward deflection of latching portions 16 as they are deflected in the direction "A" toward insertion axis "X." The material and/or dimensions of handle 12 is/are preferably selected such that handle 12 is sufficiently flexible so that movement of grasping portion 14 in the direction "D" of removal causes the latching portions 16 to deflect inwardly towards the insertion axis "X," which directions are illustrated by the arrows in FIG. 2. Handle 12 is preferably formed from a plastic material in order to impart flexibility. However, handle 12 can also be formed from a non-plastic material or a metallic material that is preferably dimensioned such that some degree of flexibility is provided.

The flexibility of exemplary handle 12 allows it to deflect and deform with respect to other assembly members associated with the modular computer system. For example, the exemplary handle 12 will not interfere when attached to a component mounted directly behind a door or cosmetic fascia. The exemplary handle 12 therefore takes up very little system enclosure volume and can be utilized in extemely tight packaging schemes. If, on the other hand, the handle 12 is formed from a material or dimensioned such that it is not flexible, the preferred deflection of the latching portion 16 or portions can be provided by a hinged assembly, a line of weakening formed in the handle, a spring biased assembly, or other equivalent structures. It will be appreciated that portions of the handle 12, such as the engagement surface or surfaces 20 and the grasping portion 14, may be formed from a material that is not flexible while the benefits of this invention are nevertheless enjoyed. In other words, any material configuration (e.g., flexible portions, non-flexible portions, or combinations of flexible and non-flexible portions) that supports the inward deflection of the latching portions 16 when grasping portion 14 is moved in the direction "D" of removal is suitable.

Similarly, the detents 18 and apertures 28 illustrated in the embodiment shown in FIG. 2 represent just one of many possible forms of a means for securing a handle to an enclosure. Other permanent or releasable securing means can be selected including, but not limited to, adhesives, bonds, fasteners, welds, or other known means of securing components with respect to one another.

Figure 3:
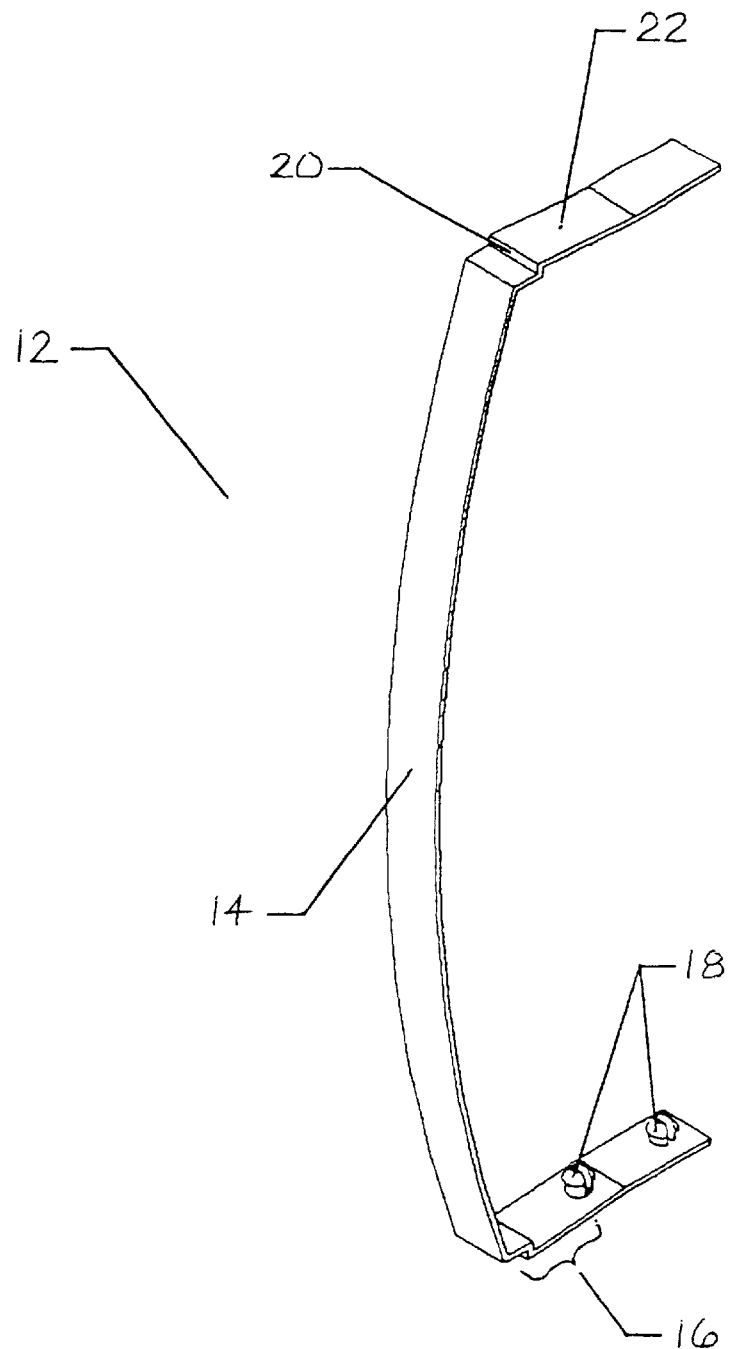
FIG. 3 is a front, perspective view of a handle component of the modular component illustrated in FIG. 1.

Referring now to FIG. 3, a front, perspective view of an exemplary embodiment of handle 12 is shown. FIG. 3 more clearly illustrates the exemplary structure of detents 18 and their relationship to the latching portions 16. Also, FIG. 3 illustrates an exemplary configuration of the ramps 22 and engagement surfaces 20 of the latching portions 16 of the handle 12.

Figure 4A:
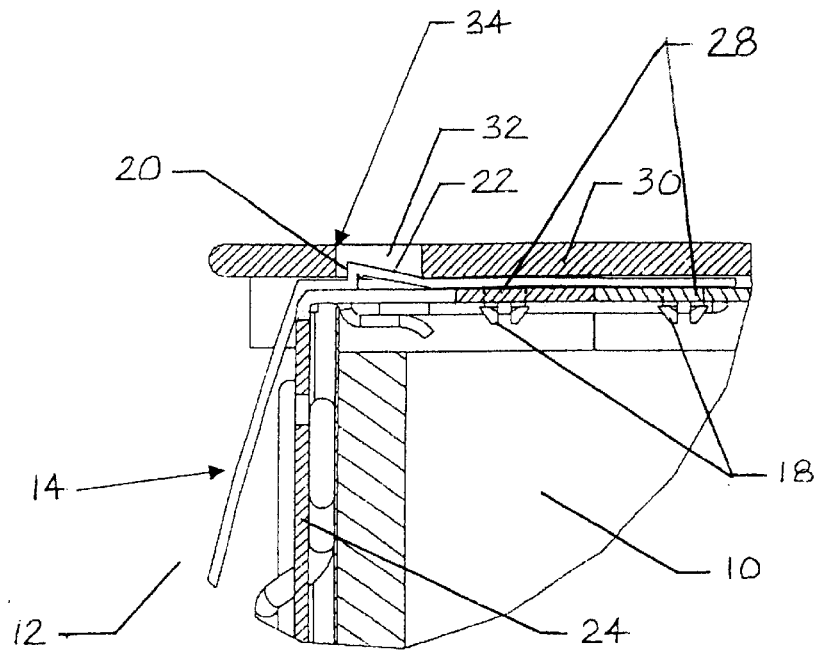
FIGS. 4A and 4B are cross-sectional top views of a portion of the modular component shown in FIG. 1, illustrating an exemplary operation of the handle component shown in FIG. 3.
Figure 4B:
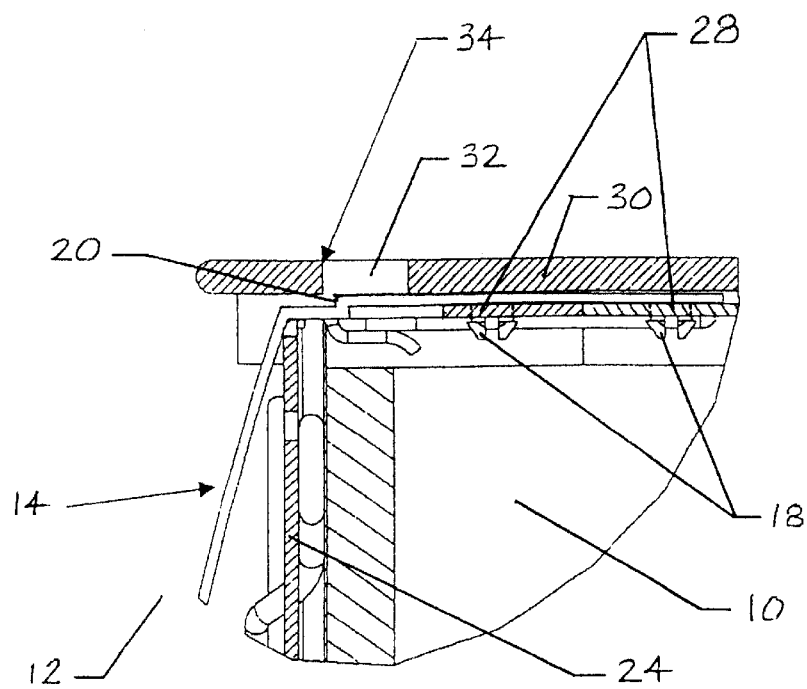

Referring now to FIGS. 4A and 4B, additional exemplary details of the illustrated embodiments are provided to describe the operation of the handle 12. As shown in FIGS. 4A and 4B, the modular component 10 is positioned within a receptacle or chassis 30, only a portion of which is illustrated. It will be appreciated that the receptacle or chassis portion 30 illustrated in FIG. 4A and FIG. 4B can be a portion of a housing for a computer system or other mechanical or electronic system. In fact, although this invention is described with primary reference to computer systems, the exemplary handle and latching system according to this invention is equally applicable to other systems as well, especially systems which include modular components that are engaged with respect to one another.

The receptacle or chassis 30 illustrated in FIG. 4A includes one or more apertures 32 (only one shown), each of which apertures 32 defines an engagement surface 34. The aperture 32 is sized and positioned to receive at least a portion of the latching portion 16 of the handle 12 (as illustrated in FIG. 4A). The engagement surface 34 is positioned and otherwise configured for engagement with the engagement surface 20 of the latching portion 16 of the handle 12. In the configuration illustrated in FIG. 4A, wherein the engagement surface 20 of the handle 12 extends into the aperture 32 of the receptacle or chassis 30, it will be appreciated that the surface 20 would interfere with the engagement surface 34 in such a way as to prevent or resist unintended separation of the modular component 10 from the receptacle or chassis 30. More specifically, the engagement surface 20 of the latching portion 16 would abut against the engagement surface 34 of the chassis 30, thereby preventing or resisting the modular component from moving or otherwise migrating from within the receptacle or chassis 30. Such movement or migration could for example be the result of unauthorized attempts to remove the module or could be the result of vibrations or other movements of the overall system.

Referring now specifically to FIG. 4B, the handle 12 is configured such that the component 10 can be intentionally removed from the receptacle or chassis 30. As was described with reference to FIG. 2, manipulation of grasping portion 14 of handle 12 in direction "D" of component removal causes a deflection of latching portions 16 inwardly toward the insertion axis "X." Also, the slots 26 formed in the enclosure 24 of the modular component 10 permit the inward deflection of latching portions 16.

As illustrated in FIG. 4B, the latching portion 16 of handle 12 is so deflected. More specifically, the latching portion 16 is deflected such that the ramp surface 22 extends substantially parallel to the insertion axis "X," and the section of latching portion 16 that defines engagement surface 20 extends at least partially within the slot 26 formed in the enclosure 24. In this deflected condition, the surface 20 of latching portion 16 is no longer in a position to interfere with the engagement surface 34 defined by the aperture 32 in the receptacle or chassis 30. Further deflection or manipulation of the grasping portion 14 in direction "D" thereby facilitates removal of the enclosure 24 of the modular component 10 from within the receptacle or chassis 30 along insertion axis "X."

Although exemplary embodiments of this invention have been described, there are others that support the spirit of the invention and are therefore within the contemplated scope of the invention. Specifically, it will be understood that a wide variety of modifications can be made to the materials, dimensions, proportions, and structures of the handle and enclosure components while still enjoying the benefits of this invention. For example, the application of this invention is not limited to computer systems, but may also include other modular systems in which a latching mechanism may be beneficial.

It will be appreciated that other modifications can be made to the illustrated embodiments without departing from the scope of the invention, which is separately defined in the appended claims.

What is claimed:

1. A handle for moving a component with respect to a receptacle along an insertion axis, said handle comprising:
   a grasping portion; and
   flexible latching portions extending from said grasping portion, each of said latching portions being configured to extend substantially parallel to said insertion axis and adjacent a surface of the component, each of said latching portions including an engagement surface extending substantially perpendicular to said insertion axis and being configured to engage a surface of the receptacle, and each of said latching portions having a detent oriented along a detent axis that extends toward said insertion axis and configured to extend through an aperture defined in the surface of the component;
   wherein manipulation of said grasping portion in a direction to remove the component from the receptacle deflects said latching portions toward said insertion axis, thereby releasing said surface of each of said latching portions from engagement with the surface of the receptacle.

2. The handle recited in claim 1, wherein each of said latching portions comprises a ramp surface positioned adjacent said engagement surface and positioned to facilitate insertion of the component.

3. The handle recited in claim 1, wherein said grasping portion is configured to extend substantially perpendicular to said insertion axis.

4. The handle recited in claim 1, wherein said handle is flexible.

5. The handle recited in claim 1, wherein said handle is formed from plastic.

6. A module configured to be inserted into a receptacle along an insertion axis, said module comprising:
   a component having an insertion axis, said component comprising an enclosure configured to extend within the receptacle along said insertion axis; and
   a handle mounted to said enclosure of said component, said handle comprising a grasping portion extending substantially perpendicular to said insertion axis of said component and at least one latching portion extending substantially parallel to said insertion axis and adjacent said enclosure, said latching portion including an engagement surface configured to engage a surface of the receptacle, wherein manipulation of said grasping portion in a direction to remove the component from the receptacle deflects said latching portion toward said insertion axis, thereby releasing said surface of said latching portion from engagement with the surface of the receptacle, said latching portion having a detent oriented along a detent axis that extends toward said insertion axis and configured to extend through an aperture defined in the enclosure of the component.

7. The module recited in claim 6, wherein said latching portion of said handle further comprises a ramp surface positioned to facilitate insertion of said component.

8. The module recited in claim 6, wherein said engagement surface of said latching portion extends substantially perpendicular to said insertion axis.

9. The module recited in claim 6, wherein said handle is flexible.

10. The module recited in claim 6, wherein said handle is formed from plastic.

11. The module recited in claim 6, wherein said handle includes a plurality of latching portions.

12. The module recited in claim 11, said grasping portion of said handle having end portions, wherein said handle includes a latching portion extending from each end portion of said grasping portion.

13. The module recited in claim 6, said component defining a recess into which at least a portion of said latching portion can extend upon said deflection.

14. A modular computer system comprising:
   a receptacle defining an engagement surface;
   an enclosure configured to extend within said receptacle along an insertion axis; and
   a flexible handle mounted to said enclosure, said handle comprising a grasping portion extending substantially perpendicular to said insertion axis and at least one latching portion extending substantially parallel to said insertion axis and adjacent said enclosure, said latching portion comprising an engagement surface positioned to engage said engagement surface of said receptacle upon insertion of said enclosure, wherein said engagement surface of said latching portion extends substantially perpendicular to said insertion axis, and wherein manipulation of said grasping portion in a direction to remove said enclosure from said receptacle deflects said latching portion toward said insertion axis and at least partially within a recess of said enclosure, thereby releasing said engagement surface of said latching portion from engagement with said engagement surface of said receptacle, said latching portion having a detent oriented along a detent axis that extends toward said insertion axis and configured to extend through an aperture defined in the enclosure.

15. The module recited in claim 14, wherein said handle is molded from plastic.

* * * * *